(12) United States Patent
Hata et al.

(10) Patent No.: US 6,882,047 B2
(45) Date of Patent: Apr. 19, 2005

(54) SEMICONDUCTOR PACKAGE INCLUDING A PLURALITY OF SEMICONDUCTOR CHIPS THEREIN

(75) Inventors: Toshiyuki Hata, Maebashi (JP); Ichio Shimizu, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 2 days.

(21) Appl. No.: 10/268,697

(22) Filed: Oct. 11, 2002

(65) Prior Publication Data
US 2003/0075796 A1 Apr. 24, 2003

(30) Foreign Application Priority Data
Oct. 19, 2001 (JP) ........................................ 2001-321297

(51) Int. Cl.[7] ........................ H01L 23/48; H01L 23/52; H01L 29/40
(52) U.S. Cl. ........................ 257/734; 257/735; 257/692; 257/690; 257/678
(58) Field of Search ............................... 257/666, 678, 257/690, 692, 734, 735

(56) References Cited

U.S. PATENT DOCUMENTS

| | | | | | |
|---|---|---|---|---|---|
| 4,891,686 | A | * | 1/1990 | Krausse, III | ................ 174/252 |
| 6,307,272 | B1 | * | 10/2001 | Takahashi et al. | ........... 257/787 |
| 6,528,880 | B1 | * | 3/2003 | Planey | ........................ 257/735 |

* cited by examiner

Primary Examiner—Mary Wilczewski
Assistant Examiner—Monica Lewis
(74) Attorney, Agent, or Firm—Mattingly, Stanger, Malur & Brundidge, P.C.

(57) ABSTRACT

A chip including a power MOS circuit in the high level side and a chip including a power MOS circuit in the low level side are accommodated within one sealing body. In this structure, the leads connecting the drain electrodes of the power MOS circuits in the high level and low level sides are set wide and are projected asymmetrically from both longer sides surfaces of the sealing body. Accordingly, the semiconductor device including a composite power MOSFET can be mounted easily.

12 Claims, 12 Drawing Sheets

SEMICONDUCTOR PACKAGE INCLUDING A PLURALITY OF SEMICONDUCTOR CHIPS THEREIN

BACKGROUND OF THE INVENTION

The present invention relates to a semiconductor device and particularly to a technique which can be effectively applied to the power supply circuit technology.

For example, a DC—DC converter (DC to DC converter) circuit is used as a power supply circuit for driving a CPU (Central Processing Unit) of an electronic device such as a personal computer, server or gate machine or the like. A composite power MOSFET (Metal Oxide Semiconductor Field Effect Transistor) of the DC—DC converter discussed by the inventors of the present invention includes a power MOSFET circuit for switching and a power MOSFET circuit as a rectifier circuit. Respective circuits are separately packaged and individually mounted on a wiring substrate.

SUMMARY OF THE INVENTION

However, the inventors of the present invention have found there are problems explained below in the composite power MOSFET structure.

Namely, since the power MOSFET for switching and the power MOSFET as a rectifier circuit are separately packaged and are individually mounted on the wiring substrate, here rises a problem that simplification of the mounting process is interfered.

An object of the present invention is to provide a technique which can provide an easier process to mount a semiconductor device including a composite power MOSFET.

The aforementioned and the other novel features of the present invention will become apparent from description of the specification and the accompanying drawings.

The typical inventions in the present invention disclosed in the present specification may be briefly explained as follows.

Namely, the present invention discloses a structure in which the power FET circuit for switching and the power FET circuit as a rectifier circuit are packaged together.

DETAILED DESCRIPTION OF THE PREFERRED EMBODIMENTS

Figure 1:
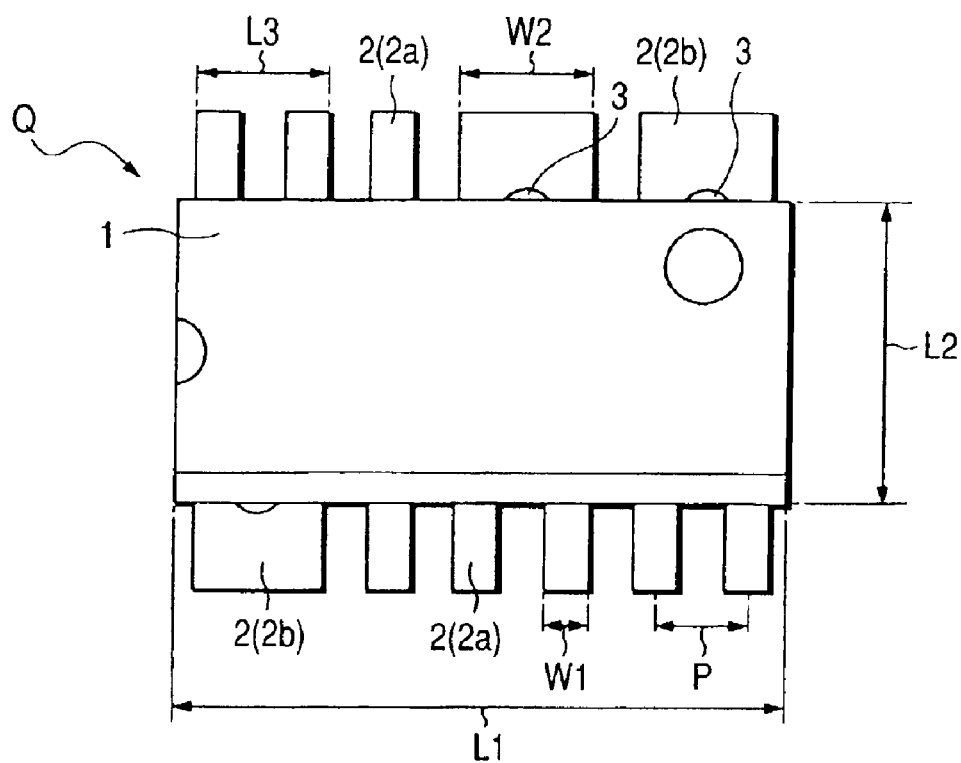
FIG. 1 is a plan view of a semiconductor device of an embodiment of the present invention.

Before the present invention will be explained in detail, the meaning of terms of the present specification will be explained below.

A preferred embodiment will be explained, when it is required, by dividing into several sections or into a plurality of embodiments. However, unless otherwise explained particularly, these are related with each other and one is in the relationship as a part or entire part of the other or in the relationship of modification example, details and complementary explanation of the other.

Moreover, in the following embodiments, when the number of elements (including quantity, values, amount and range or the like) are considered, the number is not limited to the particular number, unless otherwise indicated clearly and limited obviously to the particular number and such number of elements may be the one larger than or smaller than the particular value.

Moreover, in the following embodiments, the structuring elements (including the element steps or the like) is not limited only to the essential one, unless otherwise clearly indicated or clearly considered essential from the principle.

In the same manner, in the following embodiments, when shape and positional relationship of the structural elements are considered, these shape and positional relationship shall substantially include those approximated and similar to them, unless otherwise indicated clearly and not considered apparently from the principle thereof. This can be also adapted to the numerical values and ranges.

Moreover, the like elements are designated with like reference numerals throughout the description of the specification and the same explanation is eliminated here.

In addition, in the drawings used for explaining the embodiments of the present invention, hatching may be made even to the plan view for assuring easier viewing.

Further, in the embodiments, the MOS FET (Metal Oxide Semiconductor Field Effect Transistor) representing the field effect transistor is abbreviated as MOS, while an n-channel MOS is abbreviated as nMOS.

The preferred embodiments of the present invention will be explained in detail with reference to the accompanying drawings.

Embodiment 1

In the embodiment 1, the technical concept of the present invention has been adapted to a composite power MOS (semiconductor device) of the DC to DC converter which drives a CPU (Central Processing Unit), for example, of a personal computer, a server or an electronic device such as a game machine or the like.

Figure 2:
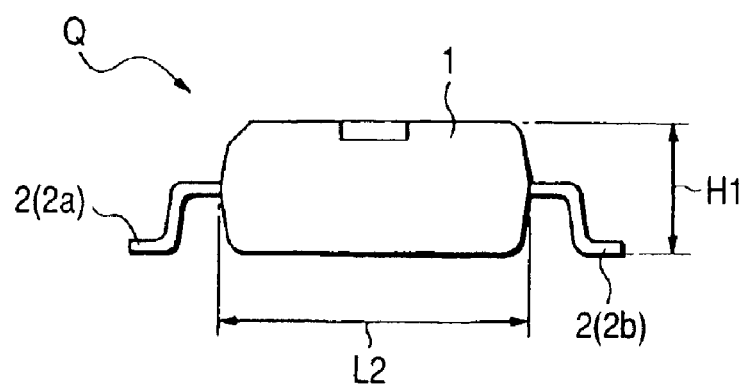
FIG. 2 is a side elevation view of the shorter side of the semiconductor device of FIG. 1.
Figure 3:
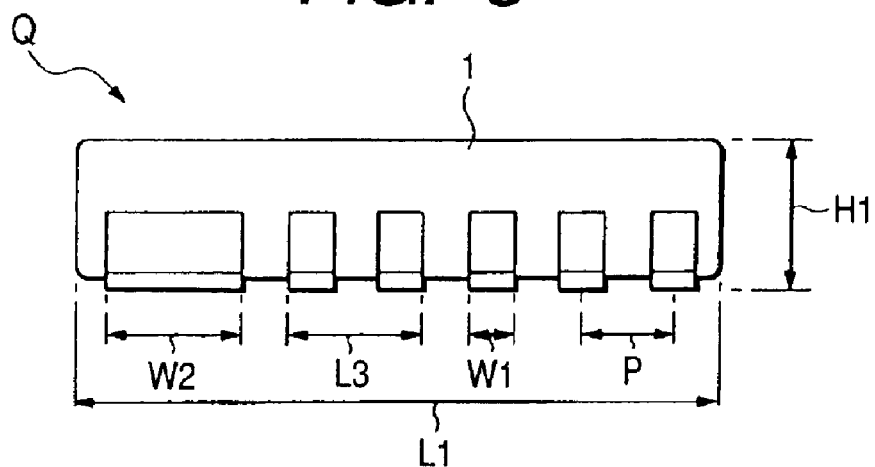
FIG. 3 is a side elevation view of the longer side of the semiconductor device of FIG. 1.
Figure 4:
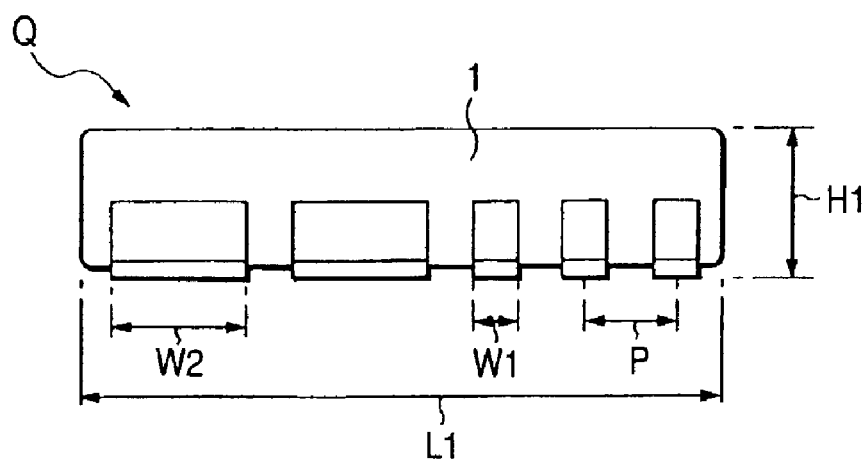
FIG. 4 is a side elevation view of the longer side of the semiconductor device of FIG. 1.

FIG. 1 to FIG. 4 illustrate external appearances of a composite power MOSQ of the embodiment 1 of the present invention. FIG. 1 is a plan view of the composite power MOSQ, while FIG. 2 is a side elevation view of the short side of the composite power MOSQ. FIG. 3 and FIG. 4 are side elevation views of the longer side of the composite power MOSQ.

The composite power MOSQ has a surface mounting type package structure, for example, like a SOP (Small Outline Package). A sealing body 1 forming a package structure of the composite power MOSQ is composed, for example, of a plastic material such as epoxy-based resin and has six surfaces. Namely, the sealing body 1 has the mounting surface opposing to the wiring substrate where the composite power MOSQ is mounted, an upper surface in the opposite (rear) side of the mounting surface, two longer side surfaces in the longer side of the sealing body 1 which is crossing the mounting surface and the upper surface, moreover two shorter surfaces in the shorter side of the sealing body 1 as the surface crossing the mounting surface, upper surface and two side surfaces. Within this sealing body 1, two kinds of power MOS circuits explained later are sealed. Length L1 of the longer side of the sealing body 1 is, for example, about 8.65 mm and length L2 of the shorter side is, for example, about 3.95 mm.

A plurality of leads 2 are projected from each surface of the longer side surfaces of this sealing body 1. The leads 2 illustrated in FIG. 1 to FIG. 4 correspond to an outer lead. These leads 2 are formed of a metal thin plate such as copper (Cu) or paradium (Pd) or the like of which surface is plated with gold (Au) or nickel (Ni)□ and the leads 2 projected from the sealing body 1 are molded in the shape of gull-wing. In this embodiment 1, the lead 2a of the ordinary width and the lead 2b of wide width are included in the leads 2 projected from both longer side surfaces of the sealing body 1. Namely, three ordinary leads 2a and two wide leads 2b are projected from one longer side surface (second surface) of the sealing body 1, while one wide lead 2b and five ordinary leas 2a are projected from the other longer side surface (first surface) of the sealing body 1.

The ordinary lead 2a is electrically connected to the source electrode and gate electrode of two kinds of the power MOS. Meanwhile, the wide lead 2b is electrically connected to the drain electrodes of two kinds of power MOS. The upper and lower wide leads 2 in FIG. 1 are disposed in the asymmetrical positional relationship with each other. Namely, the upper and lower wide leads 2b in FIG. 1 are disposed in the diagonal directions with each other. Radiation efficiency of heat generated within the sealing body 1 when the composite power MOSQ is driven can be improved by providing such wide leads 2b. When a couple of semiconductor chips where the power MOS circuits are formed are sealed within one sealing body 1, a thermal problem is generated, but in this embodiment 1, such thermal problem can be controlled and prevented by providing the wide leads 2b as explained above. Namely, even in the case of the semiconductor device where two semiconductor chips having formed the power MOS circuit are provided within one sealing body 1, reliability of operation can be improved.

Moreover, at the boundary of the internal side and external side of the sealing body 1 in the wide lead 2b, namely at the center of width direction of the wide lead 2b, a hole 3 is formed through the thickness direction of the wide lead 2b to bridge over the internal side and external side of the sealing body 1. Since the hole 3 is provided to this wide lead 2b, the sealing body 1 bites to the hole 3 and thereby close contact and bonding property of the sealing body 1 by means of the wide lead 2b can be improved. Accordingly, peeling of the sealing body 1 at the wide lead 2b can be controlled and prevented. Therefore, humidity-proof characteristic can be improved and resultant reliability of operation life of the semiconductor device can also be improved.

An adjacent pitch P of such lead 2 (adjacent pitch of ordinary lead 2a) is, for example, about 1.27 mm. Moreover, the width W1 of the ordinary lead 2a is, for example, about 0.40 mm. Moreover, the width W2 of one wide lead 2b is, for example, about 1.67 mm equal to the length L3 which is the sum of the width of two ordinary leads 2a and the adjacent interval thereof. Moreover, the mounting height H1 of the composite power MOSQ (height up to the upper surface of sealing body 1 from the surface where the lead 2 is joined to the land of wiring substrate) is, for example, about 1.70 mm.

Figure 5:
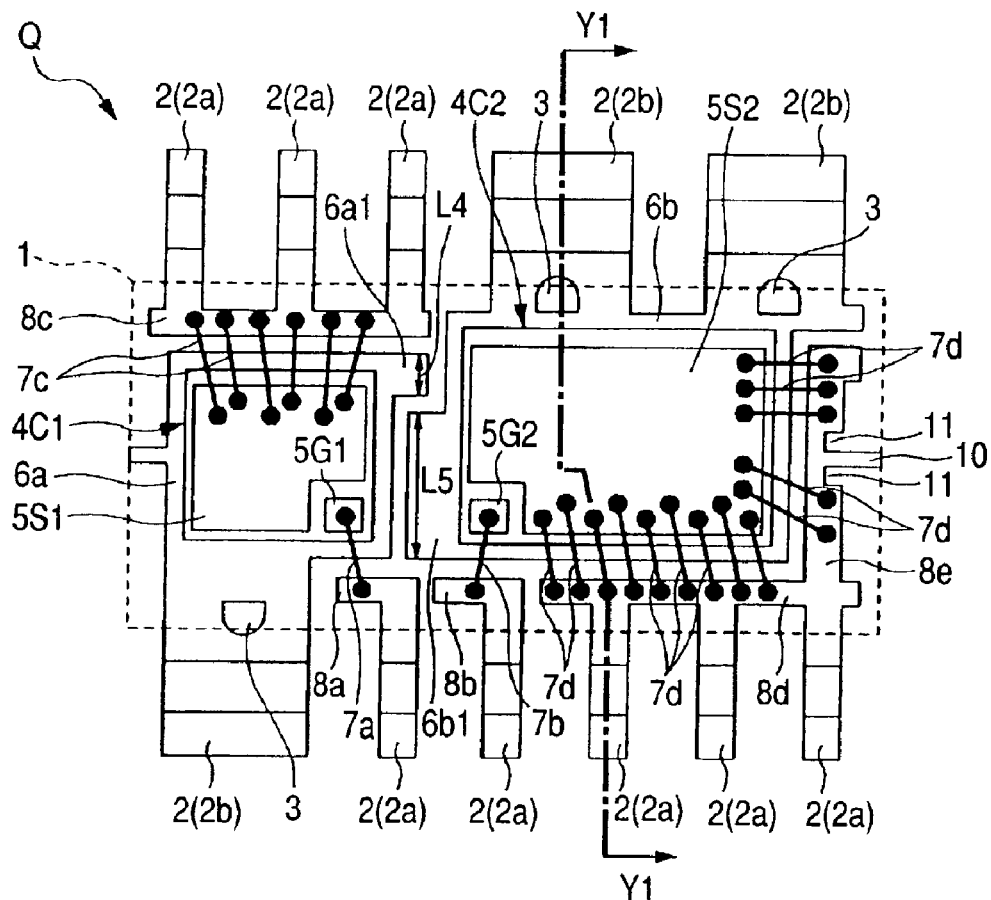
FIG. 5 is a plan view in which a sealing body is removed from the semiconductor device of FIG. 1.
Figure 6:
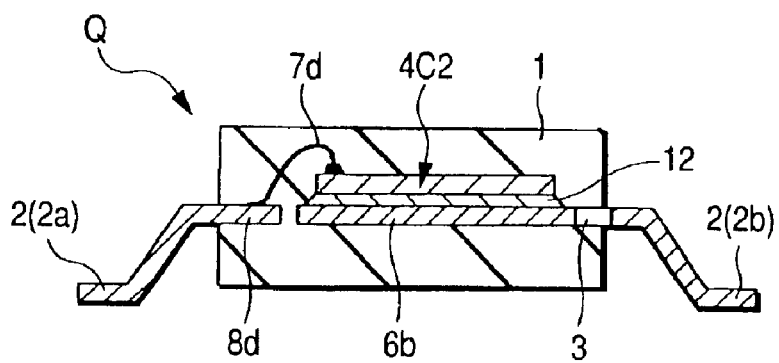
FIG. 6 is a cross-sectional view along the line Y1-Y1 of FIG. 5.
Figure 7:
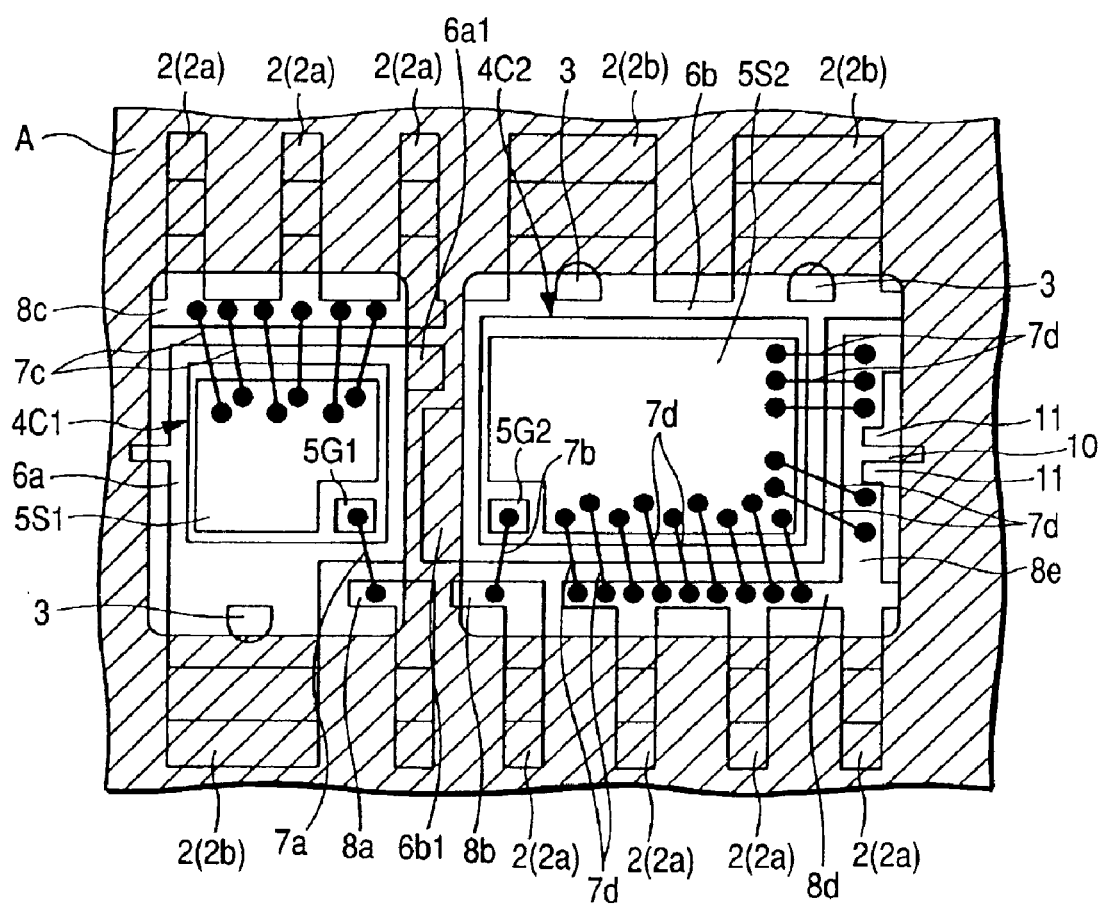
FIG. 7 is a diagram for explaining the condition where a frame is clamped in the wire bonding process.

Next, FIG. 5 is a plan view of the composite power MOSQ where the sealing body 1 is removed. FIG. 6 is a cross-sectional view along the line Y1—Y1 of FIG. 5. FIG. 7 is a diagram illustrating the condition where the frame is clamped in the wire bonding process.

Within the sealing body 1, two semiconductor chips (hereinafter, referred only to as chip) 4C1, 4C2, each chip having the square flat surface, are sealed. In the relatively smaller left side chip (first semiconductor chip) 4C1, a power MOS circuit in the high (high level) side of the composite power MOSQ is formed. In the relatively smaller chip 4C1, a parasitic capacitance can be reduced. Therefore, the operation rate of the power MOS circuit in the high side, which is always required to realize high speed operation, can be improved. A size of the chip 4C1 is for example about 2.1 mm×1.7 mm. On the other hand, in the relatively large right side chip (second semiconductor chip) 4C2, a power MOS circuit in the low (low potential) side is formed. A size of the chip 4C2 is for example, about 3.9 mm×2.0 mm. In this chip 4C2, a Schottky barrier diode which is connected between the source and drain of the power MOS as will be explained later is formed in addition to the power MOS. This Schottky barrier diode is may be formed in the other chip different from the chips 4C1, 4C2 and may also be packaged separately.

On the main surface (first surface) of these chips 4C1, 4C2, gate leadout electrodes (external terminals for first and second gate electrodes) 5G1, 5G2 of the power MOS circuits and source leadout electrodes (external terminals for first and second source electrodes) 5S1, 5S2 are patterned. The gate leadout electrodes 5G1, 5G2 of the chips 4C1, 4C2 are formed in the square patterns which are relatively smaller than the source leadout electrodes 5S1, 5S2 and are disposed near the angled-corners of the chips 4C1, 4C2. These chips 4C1, 4C2 are mounted respectively on the chip mounting areas (first and second patterns) 6a, 6b in the manner that the gate leadout electrodes 5G1, 5G2 are provided adjacently. Since the gate leadout electrodes 5G1, 5G2 of the chips 4C1, 4C2 are disposed adjacently, distance between the gate leadout electrodes 5G1, 5G2 and the pulse width modulation circuit explained later can be shortened and also set almost in the same length. Accordingly, the operation performance and reliability of the composite power MOSQ can also be improved.

The gate leadout electrodes 5G1, 5G2 of the chips 4C1, 4C2 are electrically connected to the lead bars 8a, 8b through the bonding wires (hereinafter, referred to only as wires) 7a, 7b. This lead bar 8a, 8b is a part of the inner lead of the lead 2 and is formed as a belt type pattern extending in the direction crossing the longitudinal direction of the lead 2. The lead bar (pattern for first gate) 8a is integrally formed to the second ordinary lead 2a from the lower left side of FIG. 5, while the lead bar (pattern for second gate) 8b is integrally formed to the third ordinary lead 2a from the lower left side of FIG. 5. Namely, the gate leadout electrodes 5G1, 5G2 are electrically connected to the second and third ordinary leads (leads for first and second gates) 2a, 2a from the lower left side of FIG. 5 through the wires 7a, 7b.

Moreover, the source leadout electrode (external terminal for first source electrode) 5S1 of the main surface of the chip 4C1 is electrically connected to the lead bar (pattern for first source) 8c via a plurality of wires 7c. This lead bar 8c is a part of the inner lead and is formed in the belt type pattern extending in the direction crossing the longitudinal direction of the lead 2 and is integrally formed to three ordinary leads (lead for first source) 2a in the upper side of FIG. 5. Namely, the source leadout electrode 5S1 of the power MOS circuit of chip 4C1 is electrically connected to three ordinary leads 2a in the upper side of FIG. 5.

This lead bar 8c is an structural element which may be connected, from the viewpoint of circuit, to the chip mounting area 6b in the right side of FIG. 5, but in the embodiment 1, these elements are isolated. If the lead bar 8c and the chip mounting area 6b were connected in straight, the length of the linear pattern including the lead bar 8c and chip mounting area 6b becomes extremely long. Therefore, flatness of this part becomes lower and moreover a stress increases to generate flexure when the chips 4C1, 4C2 are sealed, resulting in a problem that the sealing body 1 is peeled. On the other hand, in this embodiment 1, since the lead bar 8c and chip mounting area 6b are separated, such problem can be eliminated and the manufacturing yield an reliability of semiconductor device can be improved.

Furthermore, the source leadout electrode 5S2 of the main surface of the chip 4C2 in the right side of FIG. 5 is electrically connected to the lead bars (pattern for second source) 8d, 8e through a plurality of wires 7d. The lead bars 8d, 8e are integrally formed to the three ordinary leads (leads for second source) 2a from the lower right side of FIG. 5. Namely, the source leadout electrode 5S2 of chip 4C2 is electrically connected to the three ordinary leads 2a from lower right side of FIG. 5 via the wire 7d. The wires 7a to 7d are formed of a metal, for example, aluminum (Al) or gold (Au) or the like.

Each of the lead bars 8d, 8e is a part of the inner lead of the lead 2 and is formed in the belt type pattern extending along crossing two sides (first and second sides) of the chip 4C2. With employment of such structure, a wire 7d can be connected, from the two sides of chip 4C2, to the source readout electrode 5S2 of chip 4C2, and the wire 7d can be connected much more. Therefore, electrical resistance of the power MOS circuit in the low side formed on the chip 4C2 can be lowered. Accordingly, stability, reliability and performance of operations of the composite power MOSQ can be improved. The reason why such structure is introduced into the right side chip 4C2 of FIG. 5 is that it is desirable to make small an ON resistance because the ON time is longer than that of the power MOS circuit in the high side of the chip 4C1 and a current flows during a longer period, as explained later, in the power MOS circuit of the low side formed on the chip 4C2.

Moreover, a hanging lead 10 is also extended in the direction crossing the lead bar 8e from the position corresponding to the center of short side direction of the sealing body 1 in the lead bard 8e. This hanging lead 10 is integrally formed to the lead bar 8e. In both sides of the part where the hanging lead 10 and lead bar 8e are connected, a groove 11 is formed. This groove 11 is also extending along the extending direction of the hanging lead 10. After the sealing body 1 is formed, the lead bar 8e is pulled by the hanging lead 10 when the hanging lead 10 is cut. As a result, the sealing body 1 may be peeled or a gap may be formed in some cases between the lead bar 8e and sealing body 1. However, in this embodiment 1, since the groove 11 is formed, the sealing body 1 bites to the groove 11 to firmly fix the lead bar 8e. Accordingly the problem explained above can be controlled and prevented. Therefore, humidity-proof characteristic can be improved and thereby reliability and longer operation life of the semiconductor device can be improved.

Meanwhile, the rear surfaces (second surfaces) of chips 4C1, 4C2 are used as the drain electrodes of the power MOS circuit. The rear surface, namely drain electrode of the left side chip 4C1 of FIG. 5 is electrically connected to the chip mounting area 6a via the adhesive having conductivity. This chip mounting area 6a is integrally formed to a wide lead (first lead, lead for first drain) 2b in the lower side of FIG. 5. Namely, the drain electrode of the power MOS circuit of chip 4C1 is electrically connected to the wide lead 2b in the lower side of FIG. 5 via the chip mounting area 6a connected to the rear surface of chip 4C1. Moreover, the rear surface, namely drain electrode of the right side chip 4C2 of FIG. 5 is electrically connected to the chip mounting area 6b via the adhesive 12 having conductivity. This chip mounting area 6b is integrally formed to two wide leads (second lead, lead for second drain) 2b in the upper side of FIG. 5. Namely, the drain electrode of the power MOS circuit of chip 4C2 is electrically connected to two wide leads 2b in the upper side of FIG. 5 via the chip mounting area 6b connected to the rear surface of chip 4C2. The wide lead 2b connected to the drain electrode of chip 4C2 is disposed adjacently to the ordinary lead 2a connected to the source electrode of chip 4C1. Accordingly, the wide lead 2b connected to the drain electrode of chip 4C2 and the ordinary lead 2a connected to the source electrode of chip 4C1 can be connected more easily. In addition, since connection distance between the wide lead 2b connected to the drain electrode of chip 4C2 and the ordinary lead 2a connected to the source electrode of chip 4C1 can be set short, operation performance of composite power MOSQ can further be improved.

Moreover, in this embodiment 1, projected areas 6a1, 6b1 are formed in the sides opposing to each other of the chip mounting areas 6a, 6b. The projected areas 6a1, 6b1 are provided to be deviated with each other in the diagonal direction and the chip mounting areas 6a, 6b are disposed in the condition that the projected areas 6a1, 6a2 are engaged with each other. These projected areas 6a1, 6b1 are formed as the areas where the chip mounting areas 6a, 6b are clamped in the wire bonding process. Namely, like the clamping area A hatched in FIG. 7, the lead 2 is clamped not to generate any movement at each part of the frame during the wire bonding process and moreover the wires 7a to 7d are connected under the condition that the projected areas 6a1, 6b1 of the sides opposing to each other of the chip mounting areas 6a, 6b are clamped simultaneously.

Here, the projected areas 6a1, 6b1 are engaged with each other considering the background that if the projected areas 6a1, 6b1 are placed end to end instead of engagement, the sealing body 1 itself must be increased in size or the chips 4C1, 4C2 must be reduced in size when the size of sealing body 1 is maintained as it is, but since the projected areas 6a1, 6b1 are engaged, the chip mounting areas 6a, 6b can be maintained in the excellent condition during the wire bonding process without generation of the problem explained above. Moreover, in the embodiment 1, the projected areas 6a1, 6b1 are provided, from the viewpoint of assuring excellent clamping effect, in the areas near the connection areas of the wires 7c, 7d. Namely, in the chip mounting area 6a, the projected area 6a1 is provided in the upper sides of FIG. 5 and FIG. 7, while the projected area 6b1 is provided in the lower sides of FIG. 5 and FIG. 7 in the chip mounting area. In addition, in the embodiment 1, the length L5 of the projected area 6b1 (length in the short direction of sealing body 1, width of projected area) is set longer than the length L4 of projected area (length in the short direction of sealing body, width of projected area). The reason is that clamping process is further required because the chip mounting area 6b where the projected area 6b1 is provided is larger than the chip mounting area 6a where the projected area 6a1 is provided.

Figure 8:
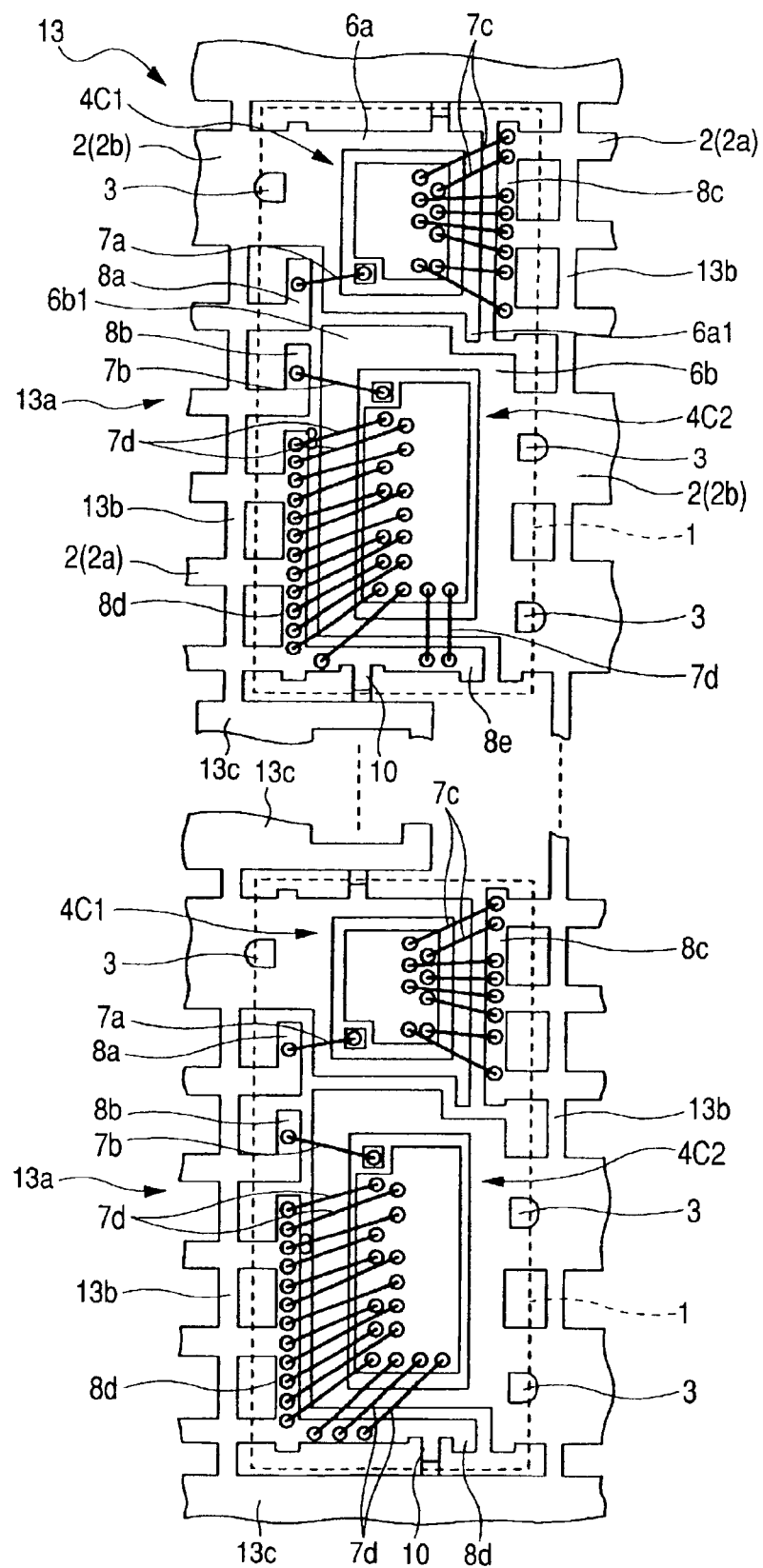
FIG. 8 is a plan view of the essential portion of the frame in the assembling process of the semiconductor device as an embodiment of the present invention.

FIG. 8 is a plan view of the essential portion of a frame 13 during the assembling process (after the wire bonding process but before sealing process) of the semiconductor device of the embodiment 1. In one frame 13, a plurality of unit frames 13a are formed. Each unit frame 13a is structured of the member which is required to form the composite power MOSQ. In this stage, the lead 2 (2a, 2b) is connected via a dam piece 13b. The dam piece 13b is cut after the sealing process. The hanging lead 10 is connected to a frame 13c. The hanging lead 10 is also cut after the sealing process.

Next, an example of device structure of the power MOS circuit formed in the chips 4C1, 4C2 will be explained with reference to FIG. 9.

Figure 9:
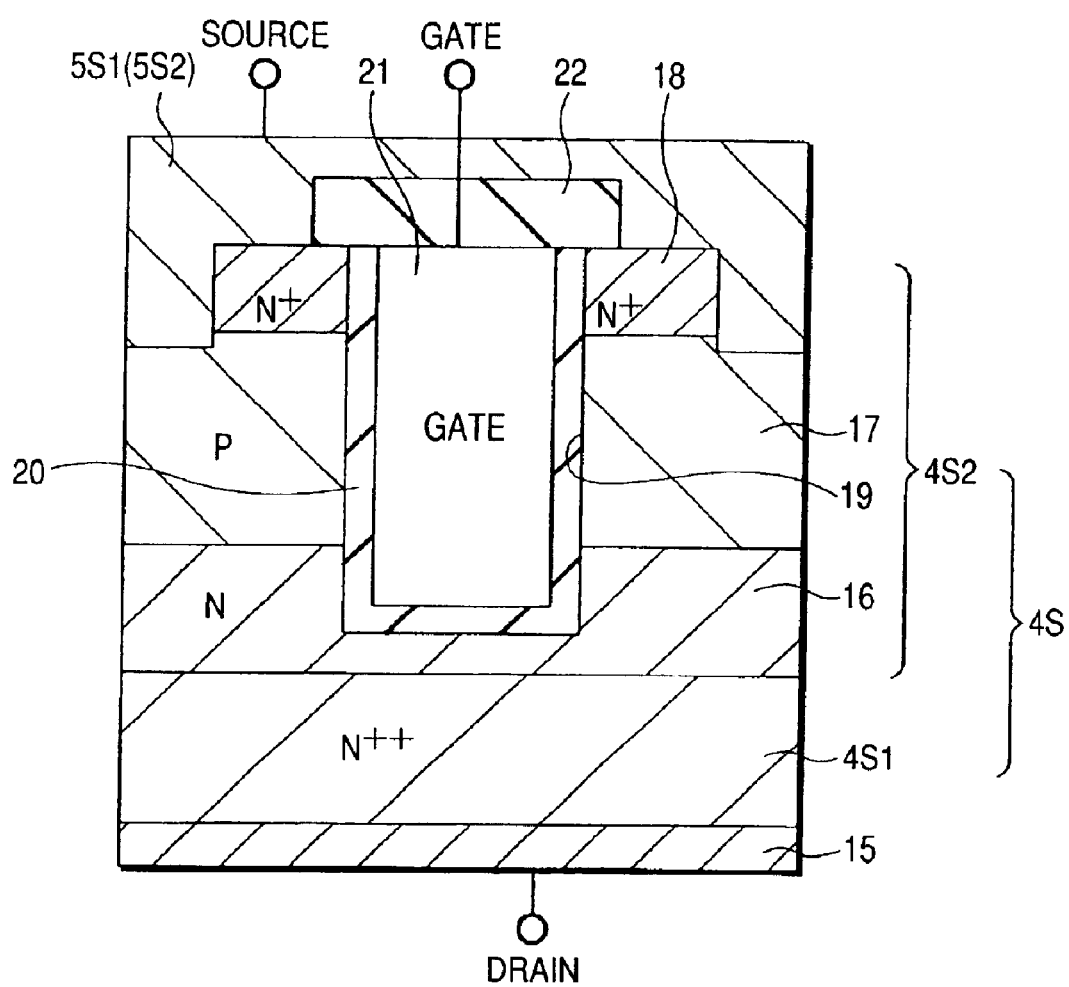
FIG. 9 is a cross-sectional view of the essential portion of a semiconductor chip forming the semiconductor device of FIG. 1.

FIG. 9 illustrates a power MOSQv forming a power MOS circuit of the embodiment 1. The power MOS circuit is formed of a plurality of power MOSQvs. A semiconductor substrate (hereinafter referred to as substrate) forming the chips 4C1, 4C2 includes a semiconductor layer 4S1 and an epitaxial layer 4S2 formed thereon. The semiconductor layer 4S1 is formed, for example, of $n^{++}$ type silicon (Si) single crystal. The epitaxial layer 4S2 is formed, for example, of n-type silicon signal crystal. This epitaxial layer 4S2 is provided with an n-type semiconductor region 16 formed of the epitaxial layer 4S2 itself, a p-type semiconductor region 17 formed thereon and an $n^+$-type semiconductor region 18 formed thereon. For example, phosphorus or arsenic is injected to the n-type semiconductor region 16 and $n^+$-type semiconductor region 18. For example, boron is injected to the p-type semiconductor region 17. At the rear surface of the substrate 4S (rear surface of the semiconductor layer 4S1), a conductive film 15 consisting, for example, of aluminum or the like is deposited by the vacuum evaporation method or sputtering method or the like. This conductive film 15 forms the drain electrode (external terminal for drain) of the power MOS circuit.

The power MOSQv is formed, for example, of an n-channel type vertical power MOS having a trench gate structure. Namely, in the groove 19 formed in the thickness direction of the epitaxial layer 4S2, the gate electrode 21 of the power MOSQv is embedded through a gate insulation film 20 formed at the internal wall surface of the groove. Since the trench gate structure is employed, scale-down of the power MOSQv can be realized and the integration degree of the power MOSQv formed in the chips 4C1, 4C2 can be improved. The gate insulation film 20 is formed, for example, of silicon oxide ($SiO_2$ or the like). The gate electrode 21 is composed, for example, of a low resistance polysilicon and is electrically connected to the gate leadout electrodes 5G1, 5G2 of the main surface of the chips 4C1, 4C2 through the conductive film consisting of a low resistance polysilicon or the like. On the gate electrode 21, a insulation film 22 for cap is deposited to realize insulation between the gate electrode 21 and source leadout electrodes 5S1, 5S2. On the main surface of the epitaxial layer 4S2, an interlayer insulation film consisting, for example, of PSG is deposited.

The $n^+$-type semiconductor region 18 allows formation of the source of power MOSQv which is electrically connected to the source leadout electrodes 5S1, 5S2 in the main surface side of the chips 4C1, 4C2. Moreover, the n-type semiconductor region 16 and semiconductor layer 4S1 are provided to form the drain of the power MOSQv. In this power MOSQv, the semiconductor region to form a channel is formed in the part opposing to the side surface of the gate electrode 21 in the p-type semiconductor region 17 between the n-type semiconductor region 16 and $n^+$-type semiconductor region 18. Namely, since this power MOSQv is a vertical type element, a drain current in the channel (condition where the conductivity type of the semiconductor region to form the channel is inverted) flows along the thickness direction (along the depth direction of groove 19) of the epitaxial layer 4S2. Namely, the drain current flowing through the conductive film 15 for drain electrode flows in turn to the source readout electrodes 5S1, 5S2 through the semiconducor layer 4S1, n-type semiconductor region 16, p-type semiconductor region 17 (channel) and $n^+$-type semiconductor region 18. In such vertical type power MOSQv, the channel length can be reduced and mutual conductance can be increased. As a result, the ON resistance can be lowered.

Next, an example of the power supply circuit using the composite power MOSQ of the embodiment 1 will be explained with reference to FIG. 10.

Figure 10:
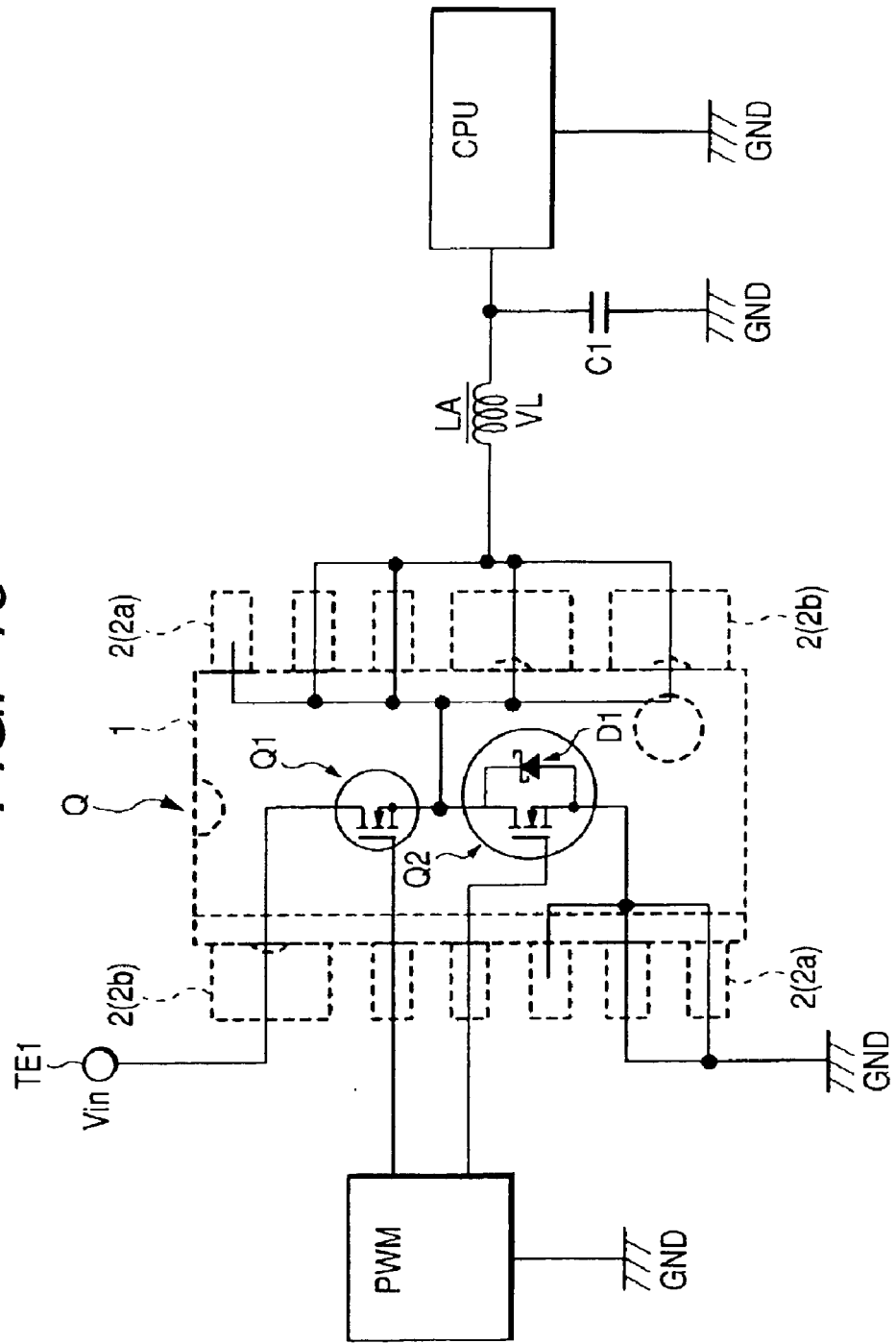
FIG. 10 is a diagram for explaining a power supply circuit using the semiconductor device of FIG. 1.

FIG. 10 illustrates a VRM (Voltage Regulation Module) to drive a CPU used, for example, in a personal computer, server or an electronic device such as a game machine. Here, as the VRM, a synchronous rectification type non-insulation DC—DC converter. The code GND means the reference potential and is set, for example, to 0V.

This non-insulation DC—DC converter includes a pulse width modulation circuit PWM and elements such as a composite power MOSQ (power MOS circuits Q1, Q2 and Schottky barrier diode D1), a coil LA with iron core and an electrolytic capacitor C1 or the like. These devices are mounted on the wiring substrate and electrically connected through the wiring of the wiring board.

The pulse width modulation circuit PWM is capable of controlling the width of switch ON of the power MOS circuits Q1, Q2 by applying the predetermined bias voltage to the gate electrodes (gate leadout electrodes 5G1, 5G2) of the power MOS circuits Q1, Q2. This pulse width modulation circuit PWM is packaged separately from the power MOS circuits Q1, Q2, etc.

The power MOS circuit Q1 in the high level side in the composite power MOSQ is a main switch of the non-insulation DC—DC converter having the switch function to accumulate the energy to the coil LA to supply the power to the output (input of CPU) of the non-insulation DC—DC converter. The drain of this power MOS circuit Q1 is electrically connected to the terminal TE1. An input voltage Vin applied to this terminal TE1 is ranged, for example, from 5V to 10V or about 12V. Moreover, the source of this power MOS circuit Q1 is electrically connected to the drain of low side power MOS circuit Q2. The low side MOS circuit Q2 is the non-insulation DC—DC MOS for rectifier having the function to lower the resistance of MOS in synchronization with the pulse width modulation frequency for the rectifying purpose. In this embodiment 1, the source of this power MOS circuit Q2 is electrically connected to the reference potential GND. Moreover, a Shottky barrier diode D1 generally resulting in small forward voltage drop is connected between the source and drain of the power MOS circuit Q2. Thereby, a voltage drop in the dead time when the power MOS circuit Q2 is turned OFF can be lowered and the subsequent pulse waveform can be raised quickly. Here, the Schootky barrier diode D1 is formed to the chip 4C2 where the power MOS circuit Q2 is formed, but it is also possible that the diode is formed in the other chip and it is then accommodated to the other package for the mounting on the wiring substrate.

In this DC—DC converter, when the high side power MOS circuit Q1 is ON, a current flows into the coil LA from the terminal TE1 for input power supply. In this case, when a current value changes, an inverse electromotive force is generated in the coil LA. A voltage of Vin-VL is impressed to the capacitor Cl. Next, the high side power MOS circuit Q1 is turned OFF. In this case, a current is supplied, with the inverse electromotive force of the coil LA, from the reference potential GND via the Schottky barrier diode D1. Thereby, charges are accumulated in the capacitor and are then consumed by the CPU as a load. When this current flows, a positive voltage is impressed across the gate and source of the low side power MOS circuit Q2 to turn ON the power MOS circuit Q2. Accordingly, a voltage drop can be reduced. When an output is lowered, the power MOS circuit Q1 is turned ON again to repeat the operation explained above. A signal in the inverse phase as the power MOS circuit Q1 is inputted to the power MOS circuit Q2. Here, in order to prevent the flow of a through-current generated when the power MOS circuits Q1, Q2 are turned ON simultaneously, the OFF period (dead time) is provided to both circuits Q1, Q2.

Figure 11:
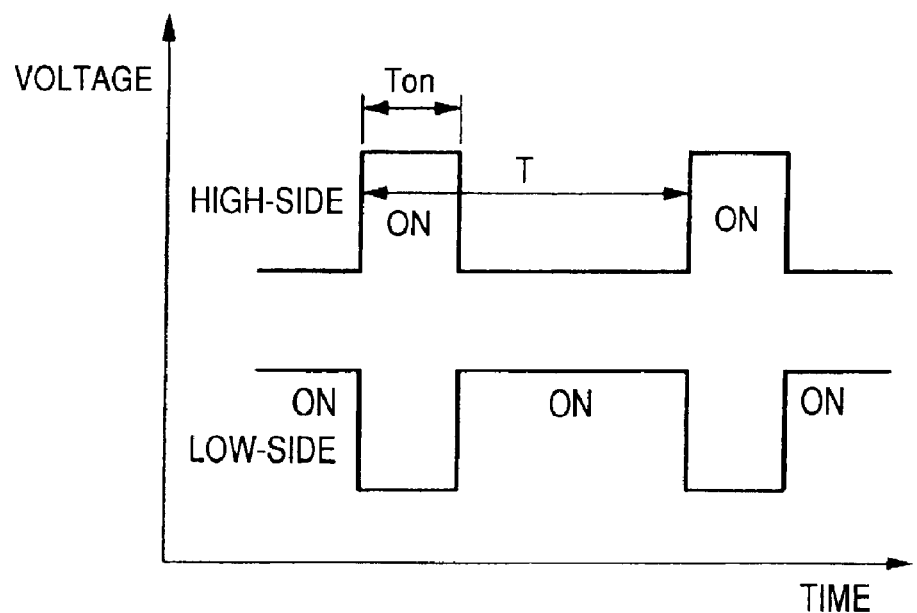
FIG. 11 is a waveform diagram illustrating a timing chart of the power supply circuit using the semiconductor device of FIG. 10.
Figure 12:
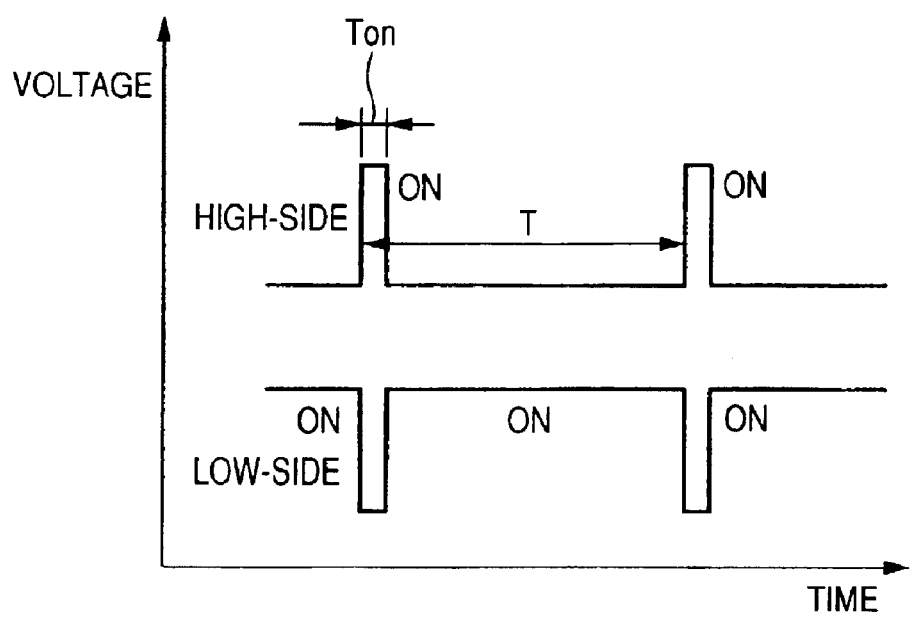
FIG. 12 is a waveform diagram illustrating a timing chart of the power supply circuit using the semiconductor device of FIG. 10.

FIG. 11 and FIG. 12 respectively illustrate the timing charts of the DC—DC converter. FIG. 12 illustrates the condition where an output voltage of the DC—DC converter is relatively lowered than that of FIG. 11. "Ton" means the pulse width when the high level side power MOS circuit Q1 is ON, while G means a pulse period. Here, an output voltage Vout of the DC—DC converter is expressed with the following formula. Vout=(Ton/T)Vin Here, Ton/T is a duty factor in the high level side power MOSQ1.

In recent years, a lower output voltage Vout (namely, an input voltage of CPU) is used. Meanwhile, the input voltage Vin is not changed and fixed to a constant value. Therefore, when output voltage Vout becomes lower as illustrated in FIG. 12, the ON time of the power MOS circuit Q1 becomes extremely short in the high level side. Accordingly, high speed operation is essential in the high level side. Therefore, it is preferable that capacitance is reduced in the high level side. In the embodiment 1, since the power MOS circuit Q1 is formed in the relatively small size chip 4C1, capacitance can be lowered for realization of high speed operation.

On the other hand, when the output voltage Vout becomes lower, the ON time of the power MOS circuit Q2 becomes longer in the low level side as illustrated in FIG. 12. Namely, in the low level side, any particular attention is not required for the switching loss or the like but since the ON time becomes longer, it is desirable that the ON resistance is reduced from the viewpoint of reduction of power consumption. In this embodiment 1, since the power MOSQ2 in the low level side has been formed with a vertical type MOS as explained above, the channel length can be shortened and thereby the mutual conductance can be increased. In other words, since the inverse number of the mutual conductance is the ON resistance, the ON resistance can be reduced.

Figure 13:
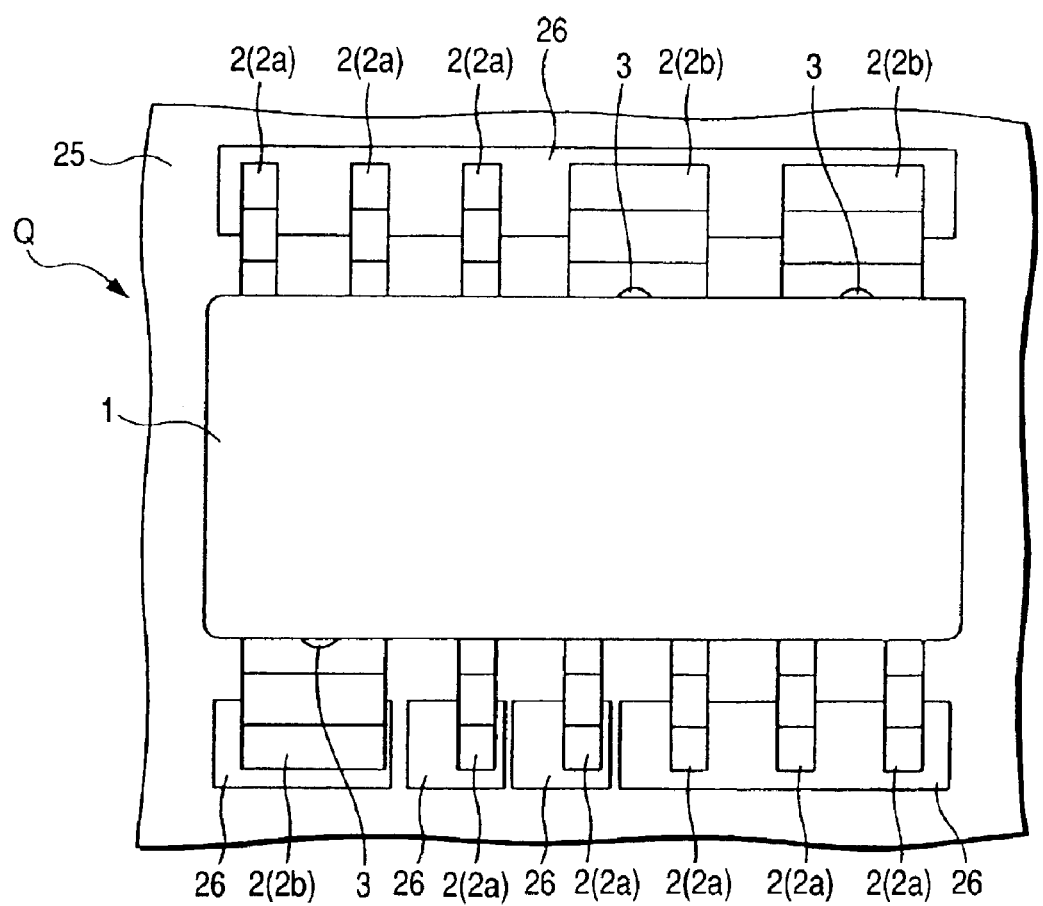
FIG. 13 is a plan view illustrating the condition that where the semiconductor device of FIG. 1 is mounted to a wiring substrate.

Next, FIG. 13 illustrates the condition where the composite power MOSQ is mounted on the printed wiring board 25. The printed wiring board 25 has the first main surface and the second main surface at the rear side thereof. On the element mounting regions of the first and second main surfaces of the printed wiring board 25, a foot pattern 25 for electrically connecting the wirings of the printed wiring board 25 and the leads of the electronic components is formed. The foot patterns 26 on the first and second main surfaces of the printed wiring board 25 are electrically connected as required through the through-holes provided in the thickness directions of the printed wiring board 25.

The composite power MOSQs are mounted on the printed wiring board 25 because the leads 2 thereof are joined with the foot pattern 26 of the first main surface of the printed wiring board 25 via the solder or the like and are also electrically connected with the wirings of the printed wiring board 25.

In this embodiment 1, since the chip 4C1 in which the power MOS circuit in the high level side and the chip 4C2 in which the power MOS circuit in the low level side are sealed within the same sealing body 1, the process to mount the composite MOSQ on the printed wiring board 25 can be done more easily than that in the case where these chips are sealed separately.

Moreover, in the embodiment 1, the source electrode of the power MOS circuit Q1 and the drain electrode of the power MOS circuit Q2 are led as the leads 2 from the same longer side surface of the sealing body 1 and these leads 2 are disposed adjacently as illustrated in the upper side of FIG. 13, these leads 2 can be connected in common with a belt type foot pattern 26 extending linearly along the longer side of the sealing body 1 at the first main surface of the printed wiring board 25. Accordingly, it is no longer required to extend the complicated wiring for long distance on the printed wiring board 25. Moreover, the shape of the foot pattern 26 for common connection can be simplified and an inductance element can also be reduced. As a result, stability of circuit operation can be improved.

Embodiment 2

In the embodiment 2, a structure that the source electrode of the power MOS circuit in the high level side the drain electrode of the power MOS circuit in the low level side are electrically connected within the sealing body will be explained.

Figure 14:
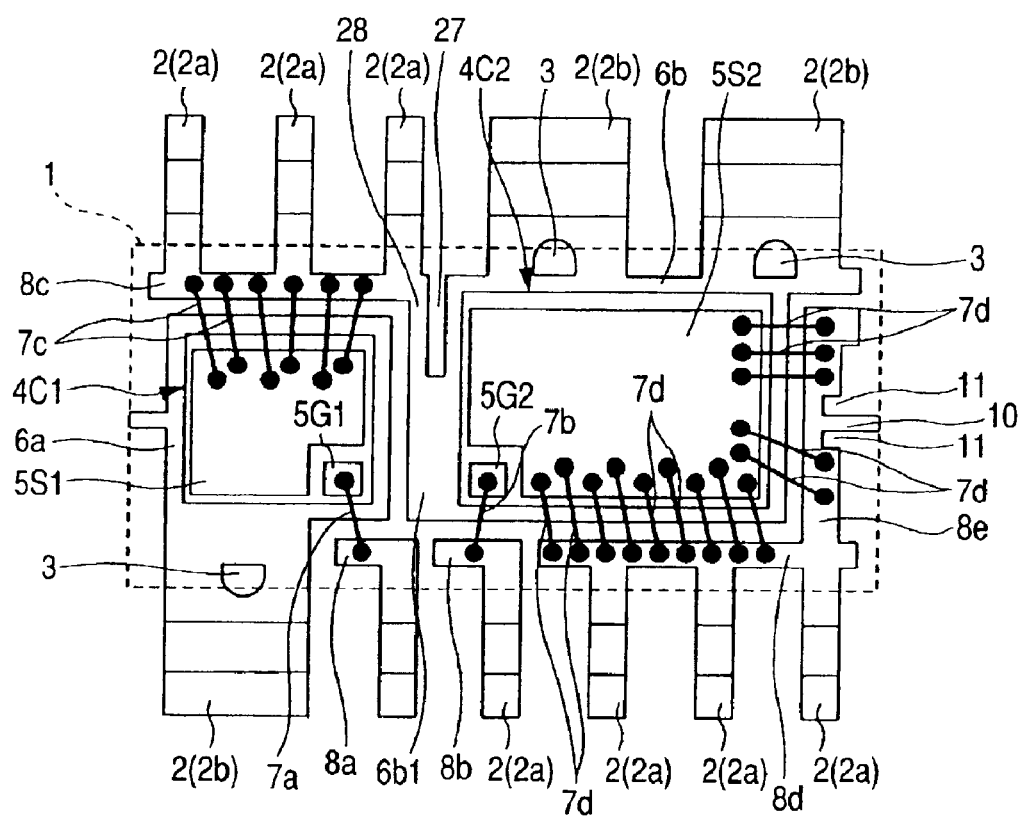
FIG. 14 is a plan view where the sealing body is removed from the semiconductor device of the other embodiment of the present invention.

FIG. 14 is a plan view of a composite power MOSQ of the embodiment 2. In FIG. 14, a sealing body 1 is indicated with a broken line. In this embodiment 2, a lead bar 8c is electrically connected to a chip mounting area 6b. However, a groove 27 is provided between the lead bar 8c and chip mounting area 6b. Thereby, the lead bar 8c and chip mounting area 6b are not connected in direct. Namely, in FIG. 14, the lead bar 8c and chip mounting area 6b are electrically connected with a connecting pattern 28. The connecting pattern 28 is formed to be extended up to the angled portion of the projected area 6b1 of the chip mounting area 6b along the direction crossing the extending direction of the lead bar 8c from the right side end part of the lead bar 8c. This structure has been proposed to control or prevent the disadvantages which are generated when the lead bar 8c and chip mounting area 6b are connected linearly. Namely, when these lead bar 8c and chip mounting area 6b are connected linearly, the length of the linear pattern including the lead bar 8c and chip mounting area 6b becomes extremely long, flatness accuracy of this part is lowered, flexure is generated because a stress increases when the chips 4C1, 4C2 are sealed and thereby a problem that the sealing body 1 is peeled is generated.

In the embodiment 2, when the composite power MOSQ is mounted, the lead 2 of the source of the power MOSQ1 and the lead 2 of drain of the power MOSQ2 are electrically connected with the common foot pattern 26. In this embodiment 2, since the inductance element can further be reduced by electrically connecting the lead 2 of source of the power MOSQ1 and the lead 2 of drain of the power MOSQ2 at both internal and external sides of the sealing body 1. Accordingly, stability of circuit operation can further be improved.

Figure 15:
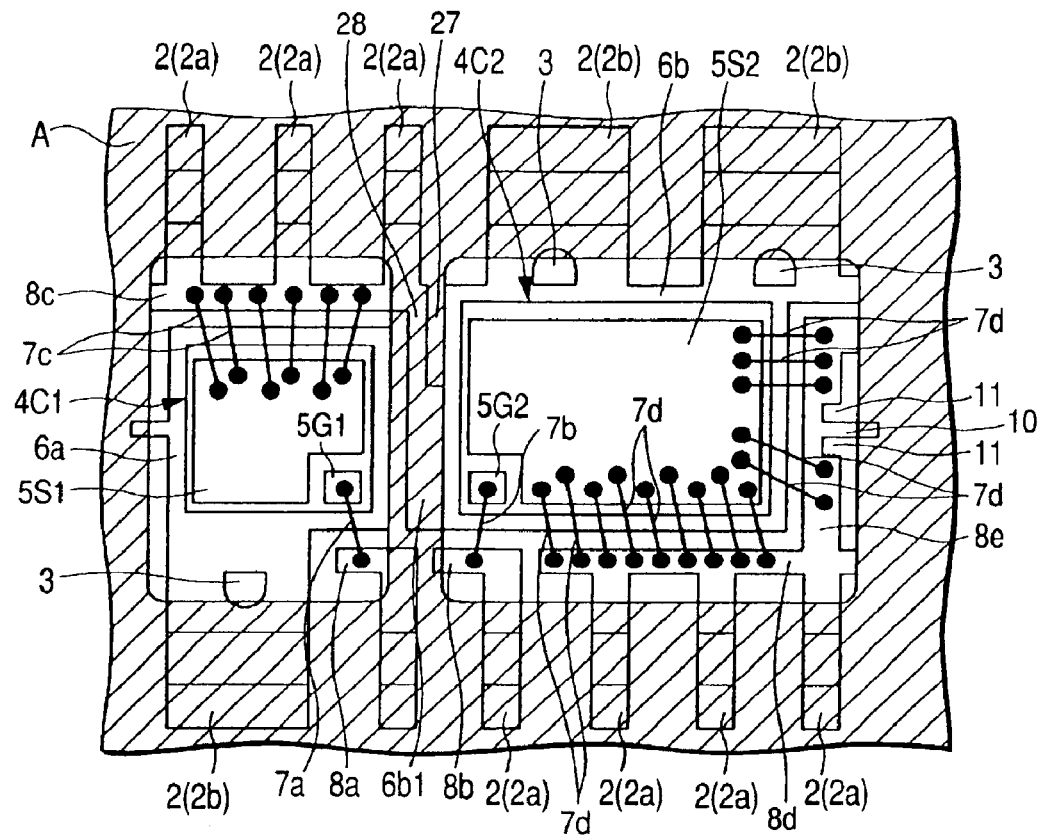
FIG. 15 is a diagram for explaining the condition where a frame is clamped during the wiring bonding process of the semiconductor device of FIG. 14.

FIG. 15 illustrates the condition that the frame is clamped in the wire bonding process of the embodiment 2. In this embodiment 2, a relatively larger chip mounting area 6b is clamped with the projected area 6b1 and pattern 28 but a relatively small chip mounting area 6a is not clamped as illustrated in the figure.

Embodiment 3

In the embodiment 3, a modification example of a frame clamping means in the wire bonding process will be explained.

Figure 16:
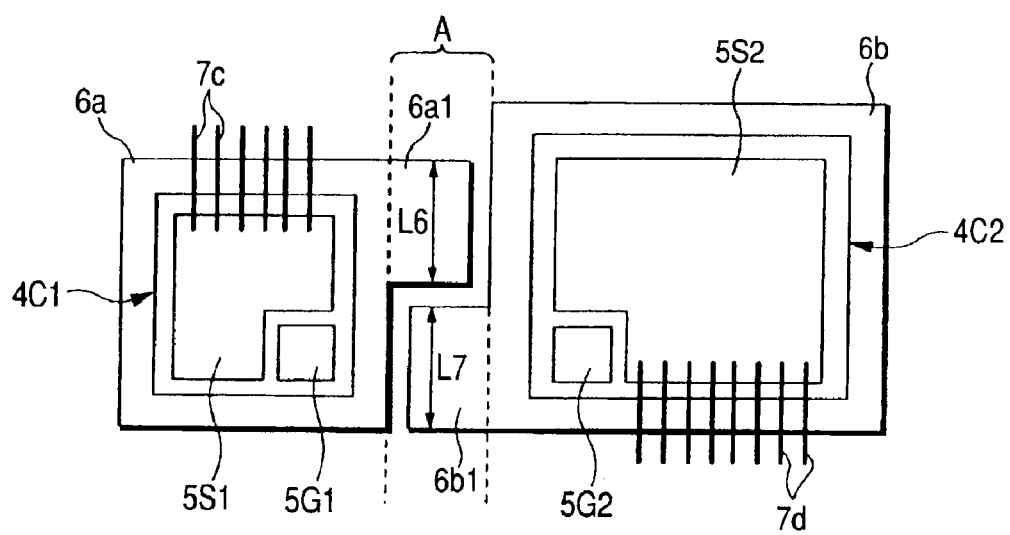
FIG. 16 is a plan view of a chip mounting area of the semiconductor device as the other embodiment of the present invention.

FIG. 16 is a plan view of the chip mounting areas 6a, 6b. Here, the length L6 of the projected area 6a1 of the chip mounting area 6a is set equal to the length L7 of the projected area 6b1 of the chip mounting area 6b.

Figure 17:
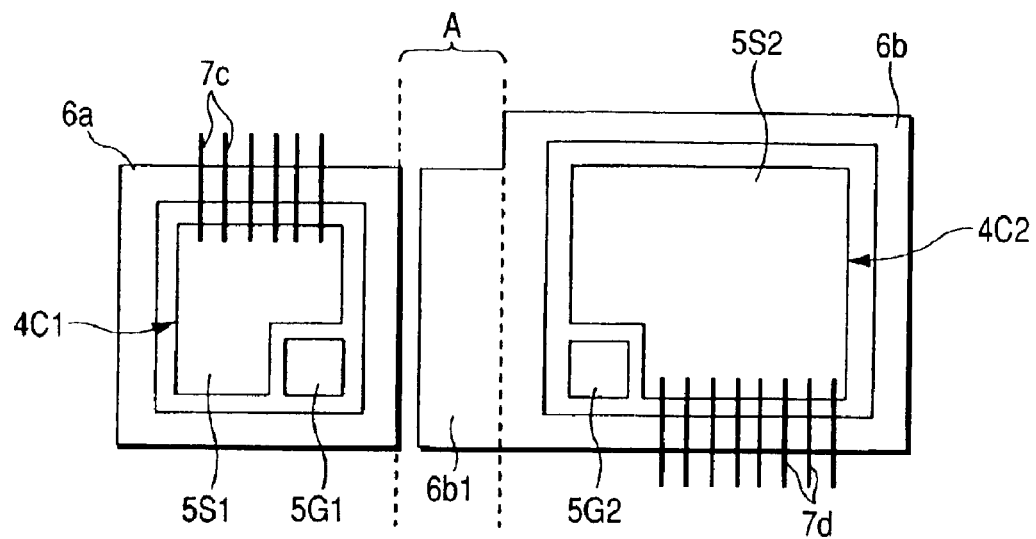
FIG. 17 is a plan view of the chip mounting area of the semiconductor device as the other embodiment of the present invention.

Moreover, FIG. 17 is a plan view of the other example of the chip mounting areas 6a, 6b. The projected area 6b1 is formed in the relatively small size chip mounting area 6b but the projected area is not formed to the relatively small chip mounting area 6a. Namely, in the wire bonding process, the relatively large chip mounting area 6b is clamped by clamping the projected area 6b1, but the relatively small chip mounting area 6a cannot be clamped because the clamping area A is never overlapped.

Figure 18:
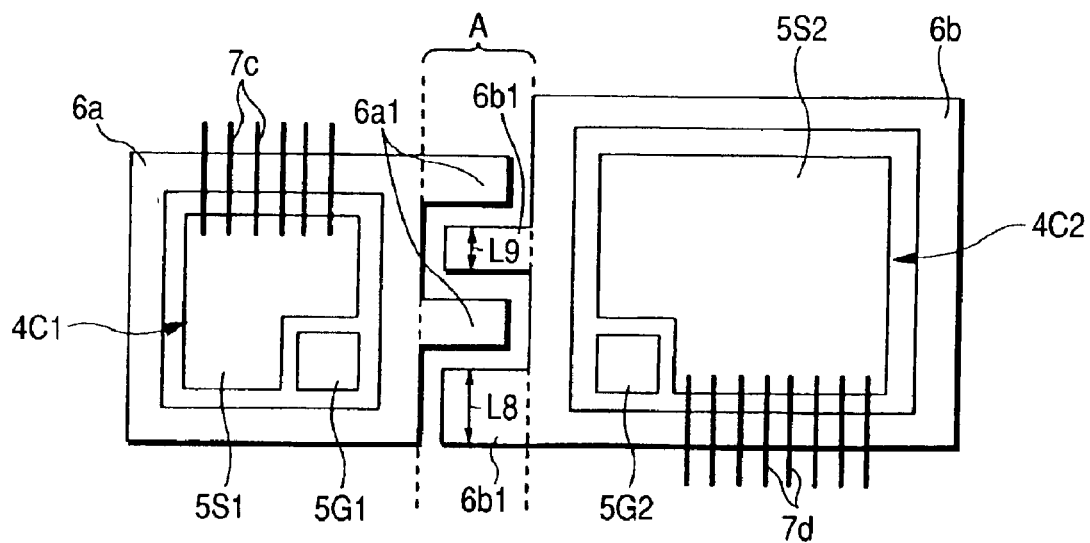
FIG. 18 is a plan view of the chip mounting area of the semiconductor device as the other embodiment of the present invention.

Moreover, FIG. 18 is a plan view of the other example of the chip mounting areas 6a, 6b. Here, a plurality of projected areas 6a1, 6b1 are formed in the chip mounting areas 6a, 6b. The chip mounting areas 6a, 6b are disposed in such a manner that a plurality of projected areas 6a1, 6b1 are engaged with each other. Moreover, in the chip mounting area 6b, the length L8 of one projected area 6b1 near to the connecting position of the wire is set longer then the length L9 of the other projected area 6b1.

The present invention has been explained practically with reference to the accompanying drawings but the present invention is not limited to the above embodiments and allows, of course, various changes or modifications within the scope not departing from the claims thereof.

For example, in above embodiments 1 to 3, the power MOS of the high level side power MOS circuit is formed of the vertical type MOS, but the present invention is not limited thereto and the power MOS of the high level side power MOS circuit, for example, may be formed of the lateral type MOS. Since distance between the gate electrode and drain of the lateral type MOS can be set larger than that of the vertical type MOS, a parasitic capacitance between the gate and drain can be reduced. Accordingly, the switching loss and drive loss of power MOS can be lowered. Therefore, the lateral type MOS can be used to cover the high speed operation of the high level side power MOS circuit.

In above explanation, the present invention has been adapted to the power supply circuit to drive the CPU which is the background of the present invention, but the present invention is not limited thereto and can also be adapted to the power supply circuit to drive the other circuits.

The typical effects of the present invention will be explained below.

Namely, since the power FET circuit for switching and the power FET circuit as the rectifier circuit are packaged in the same package simultaneously, the mounting process of a semiconductor device including a composite power MOS-FET can simplified easily.

What is claimed is:

1. A semiconductor device comprising:
   a first semiconductor chip including a first field effect transistor;
   an external terminal for first gate electrode and an external terminal for first source electrode formed on a first surface of said first semiconductor chip;
   a first drain electrode formed on a second surface on the opposite side from said first surface of said first semiconductor chip;
   a first pattern to which said first semiconductor chip is mounted in connection with said first drain electrode;
   a pattern for first gate disposed adjacent to said first pattern but separately from said first pattern and electrically connected to said external terminal for first gate electrode via a bonding wire;
   a pattern for first source disposed adjacent to said first pattern but separately from said first pattern and electrically connected to said external terminal for first source electrode via a bonding wire;
   a second semiconductor chip which is different from said first semiconductor chip and includes a second field effect transistor;
   an external terminal for second gate electrode and an external terminal for second source electrode formed on a first surface of said second semiconductor chip;
   a second drain electrode formed on a second surface on the opposite side from the first surface of said second semiconductor chip;
   a second pattern to which said second semiconductor chip is mounted in connection with said second drain electrode;
   a pattern for second gate disposed adjacent to said second pattern but separately from said second pattern and electrically connected to said external terminal for second gate electrode via a bonding wire;
   a pattern for second source disposed adjacent to said second pattern but separately from said second pattern and electrically connected to said external terminal for second gate electrode via a bonding wire;

a sealing body for sealing said first and second semiconductor chips, said first and second patterns, said patterns for first and second gates, said patterns for first and second sources and said bonding wires, said sealing body having a first surface of sealing body, and a second surface of sealing body opposite to said first surface of sealing body;

a lead for first drain integrally formed to said first pattern and projected from said first surface of sealing body;

a lead for first gate integrally formed to said pattern for first gate and projected from said first surface of sealing body;

a lead for first source integrally formed to said pattern for first source and projected from the second surface of sealing body in the opposite side of said first surface of sealing body;

a lead for second drain integrally formed to said second pattern and projected from said second surface of sealing body;

a lead for second gate integrally formed to said pattern for second gate and projected from said first surface of sealing body;

a lead for second source integrally formed to said pattern for second source and projected from said first surface of sealing body, wherein said leads for first and second drains are formed wider than the leads for first and second gates and the leads for first and second sources are projected from said first and second surfaces of sealing body in an asymmetrical positional relationship with each other.

2. A semiconductor device according to claim 1, wherein a hole is provided to said leads for first and second drains so that a part of said sealing body overlaps.

3. A semiconductor device according to claim 1, wherein said first semiconductor chip and second semiconductor chip are disposed so that said external terminal for first gate electrode formed on the first surface of first semiconductor chip and said external terminal for second gate electrode formed on the first surface of second semiconductor chip are provided adjacently.

4. A semiconductor device according to claim 1, wherein said pattern for first source is electrically isolated so as not to be connected linearly to said second pattern.

5. A semiconductor device according to claim 1, wherein said pattern for first source is electrically connected to said second pattern, and a groove is provided between said pattern for first source and said second pattern so that both patterns are not connected linearly.

6. A semiconductor device according to claim 1, wherein said pattern for second source extends along a first side of said second semiconductor chip and further extends along a second side crossing the first side of said second semiconductor chip.

7. A semiconductor device according to claim 6, wherein a groove is provided near the connecting point of a hanging lead connected to said pattern for second source extending along the second side of said second semiconductor chip.

8. A semiconductor device according to claim 1, wherein projected areas are provided to the sides opposing to each other of said first and second patterns, and said first and second patterns are disposed so that the projected areas are engaged with each other.

9. A semiconductor device according to claim 8, wherein said second semiconductor chip is larger in size than said first semiconductor chip, and the width of said projected area of said second pattern is set larger than the width of said projected area of said first pattern.

10. A semiconductor device according to claim 8, wherein the projected area of said first pattern is provided in the side where a bonding wire for connecting said external terminal for first source electrode to said pattern for first source is connected in the opposing side of said first pattern, while the projected area of said second pattern is provided in the side of said second pattern where a bonding wire for connecting said external terminal for second source electrode to said pattern for second source is connected in the opposing side of said second pattern.

11. A semiconductor device according to claim 1, wherein said first field effect transistor is a power MOSFET in a high level side forming a power supply circuit, while said second field effect transistor is a power MOSFET in a low level side forming a power supply circuit.

12. A semiconductor device according to claim 1, wherein said first semiconductor chip is smaller in size than said second semiconductor chip.

* * * * *